(12) United States Patent
Kawahara

(10) Patent No.: US 7,986,025 B2
(45) Date of Patent: Jul. 26, 2011

(54) SEMICONDUCTOR DEVICE AND METHOD FOR MANUFACTURING SAME

(75) Inventor: Naoyoshi Kawahara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 675 days.

(21) Appl. No.: 11/877,916

(22) Filed: Oct. 24, 2007

(65) Prior Publication Data

US 2008/0099889 A1    May 1, 2008

(30) Foreign Application Priority Data

Oct. 26, 2006  (JP) .................................. 2006-291187

(51) Int. Cl.
*H01L 29/00* (2006.01)
*H01L 29/73* (2006.01)

(52) U.S. Cl. ........................................ 257/529; 257/209
(58) Field of Classification Search .................. 257/209, 257/529, 665, E21.592, E23.149
See application file for complete search history.

(56) References Cited

U.S. PATENT DOCUMENTS

| 6,300,232 B1 * | 10/2001 | Satoh .............................. 438/601 |
| 6,730,982 B2 * | 5/2004 | Barth et al. ..................... 257/529 |
| 7,510,914 B2 * | 3/2009 | Yoon et al. ..................... 438/132 |
| 7,556,989 B2 * | 7/2009 | Cho et al. ....................... 438/132 |
| 2005/0161766 A1 * | 7/2005 | Sato et al. ....................... 257/529 |

FOREIGN PATENT DOCUMENTS

| JP | 09-069607 A | 3/1997 |
| JP | 2005-079156 A | 3/2005 |
| JP | 2005-522055 A | 7/2005 |
| WO | 03/085735 A1 | 10/2003 |

* cited by examiner

*Primary Examiner* — Hung Vu
(74) *Attorney, Agent, or Firm* — Young & Thompson

(57) ABSTRACT

When a metal cap film is provided on an electric fuse, the break-ability of the electric fuse is reduced. A semiconductor device 1 includes interconnects 10, an electric fuse 20 and metal cap films 30. Both of the interconnects 10 and the electric fuse 20 are composed of Cu. The interconnects 10 and the electric fuse 20 are provided in the same layer in the interconnect layer 40. The metal cap films 30 are provided only on the interconnects 10 and not provided on the electric fuse 20.

9 Claims, 7 Drawing Sheets

US 7,986,025 B2

SEMICONDUCTOR DEVICE AND METHOD FOR MANUFACTURING SAME

This application is based on Japanese patent application No. 2006-291187, the content of which is incorporated hereinto by reference.

BACKGROUND

1. Technical Field

The present invention relates to a semiconductor device and a method for manufacturing thereof.

2. Related Art

FIG. 7 is a perspective view, showing a conventional semiconductor device. A semiconductor device 100 includes an interconnect 101, a dummy interconnect 102 and an electric fuse 103. The electric fuse 103 is formed as a portion of the interconnect 101. The interconnect 101, the dummy interconnect 102 and the electric fuse 103 are composed of copper (Cu). Further, a metal cap film 104 is formed over the interconnect 101, the dummy interconnect 102 and the electric fuse 103.

In addition to above, conventional technologies related to the present invention are disclosed in Japanese Patent Unexamined Publication No. 2005-522055 for International Application, Japanese Patent Laid-Open No. H09-69607 (1995) and Japanese Patent Laid-Open No. 2005-79156.

Since a resistance for electromigration (EM) in the interconnect 101 (EM resistance) is enhanced by providing the metal cap film 104 in this way, an improved reliability of the interconnect 101 can be achieved. However, this brings a disadvantage in the operation of the electric fuse 103. More specifically, the presence of the metal cap film 104 on the electric fuse 103 provides an increased EM resistance, resulting in that the electric fuse 103 is difficult to cut.

SUMMARY

According one aspect of the present invention, there is provided a semiconductor device, comprising: an interconnect composed of copper and provided in an interconnect layer; an electric fuse composed of copper and provided in the interconnect layer, said electric fuse and said interconnect being provided in a same layer in said interconnect layer; and a metal cap film provided only on the interconnect and not provided on the electric fuse.

According another aspect of the present invention, there is provided a method for manufacturing a semiconductor device, comprising: forming an interconnect in an interconnect layer; forming an electric fuse provided in the interconnect layer that also includes the interconnect; and forming a metal cap film provided only on the interconnect and not provided on the electric fuse.

In the present invention, the metal cap film provided only on the interconnect and not provided on the electric fuse. In other words, no metal cap film is provided on the electric fuse. This allows obtaining an interconnect exhibiting higher reliability without deteriorating a breaking ability of the electric fuse.

According to the present invention, a semiconductor device and a method for manufacturing thereof can be achieved, which allow obtaining an interconnect exhibiting higher reliability without deteriorating a breaking ability of the electric fuse.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations of semiconductor devices and methods for manufacturing semiconductor devices according to the present invention will be described in reference to the annexed figures. In all figures, identical numeral is assigned to an element commonly appeared in the description of the present invention in reference to the figures, and the detailed description thereof will not be repeated.

Figure 1:
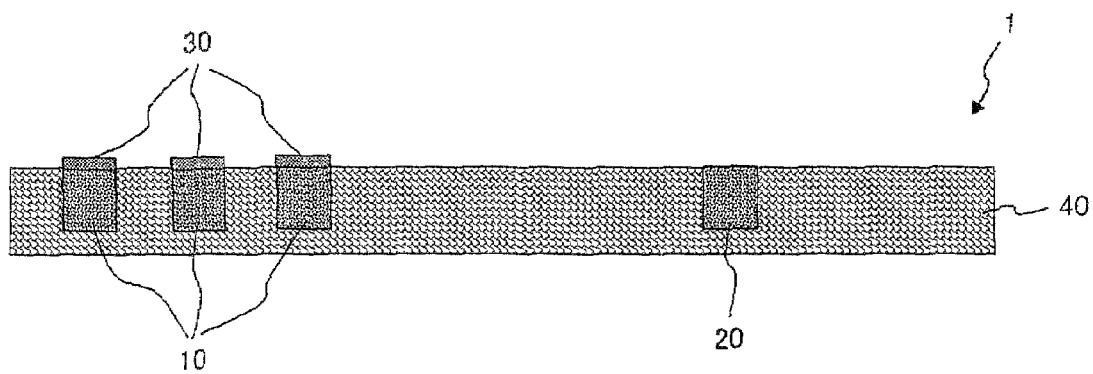
FIG. 1 is a cross-sectional view, showing an embodiment of a semiconductor device according to the present invention.

FIG. 1 is a cross-sectional view showing an embodiment of a semiconductor device according to the present invention. A semiconductor device 1 includes interconnects 10, an electric fuse 20 and metal cap films 30. Both of the interconnect 10 and the electric fuse 20 are composed of copper (Cu). The interconnects 10 and the electric fuse 20 are provided in the same layer in the interconnect layer 40. The interconnect layer 40 is provided on a semiconductor substrate such as a silicon substrate (not shown).

A data ratio in a region in vicinity of the electric fuse 20 (first ratio), is smaller than a data ratio in a region provided with the interconnect 10 (second data ratio). It is preferable that the first data ratio is equal to or lower than 5%, and the second data ratio is equal to or higher than 10%. Here, the data ratio is an areal ratio of a conductor or conductors occupied in a certain region in a surface that is in parallel with the substrate. More specifically, area dominated by a conductor or conductors in a certain region is divided by the entire area of such certain region and multiplied by 100 to obtain data ratio (%).

Further, a distance between a conductor, which is provided in the layer that includes the interconnect 10 and the electric fuse 20 and which is closest to the electric fuse 20, and the electric fuse 20 is larger than a distance between another conductor, which is also provided in the layer that includes the interconnect 10 and the electric fuse 20 and which is closest to the interconnect 10. The above-described conductors include a dummy interconnect 50 as will be discussed later, in addition to the interconnect 10 and the electric fuse 20.

The metal cap films 30 are provided only on the interconnects 10 and not provided on the electric fuse 20. More specifically, the upper surface of the interconnect 10 is covered with the metal cap film 30, and on the other hand, the upper surface of the electric fuse 20 is not covered with the metal cap film 30. The metal cap film 30 is preferably a film containing cobalt (Co) or nickel (Ni). Material for the film containing Co typically includes cobalt tungsten phosphorous (CoWP), cobalt tungsten (CoW), cobalt phosphorous (CoP), cobalt tungsten boron (CoWB) and cobalt boron (CoB). Further, material for the film containing Ni typically includes nickel tungsten phosphorous (NiWP), nickel tungsten (NiW), nickel phosphorous (NiP), nickel tungsten boron (NiWB) and nickel boron (NiB). Among these, CoWP film is particularly preferable for composing the metal cap film 30.

Figure 2:
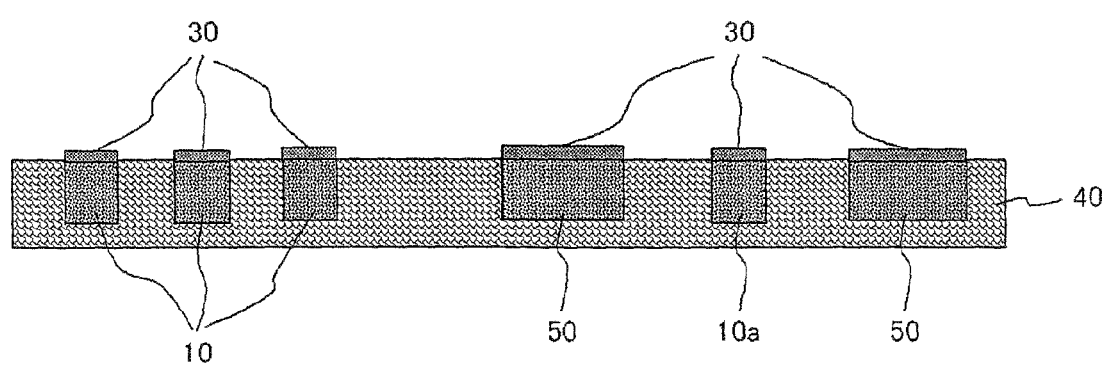
FIG. 2 is a cross-sectional view, showing other sections of the semiconductor device of FIG. 1.

FIG. 2 is a cross-sectional view, illustrating another cross section of the semiconductor device 1, which is different from the cross section shown in FIG. 1. As shown in FIG. 2, the dummy interconnects 50 composed of Cu are provided in vicinity of the interconnect 10a, which is provided at relatively lower occupancy, though the occupancy of the arranged interconnects 10 depends on locations. The metal cap films 30 are also provided on the dummy interconnects 50.

Figure 3:
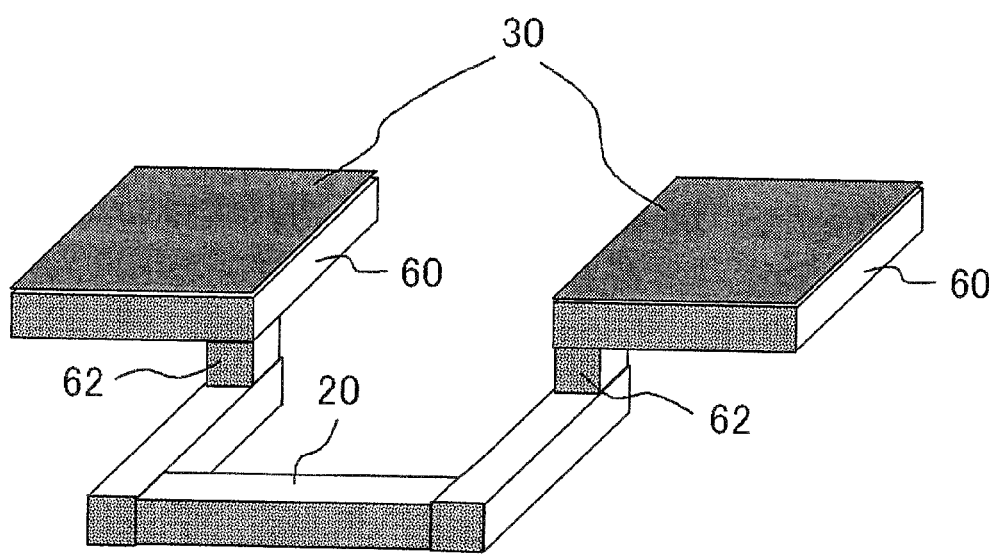
FIG. 3 is a perspective view, showing an electric fuse.

FIG. 3 is a perspective view, illustrating the electric fuse 20. Both ends of the electric fuse 20 are coupled to terminals 60 through via plugs 62. This allows creating electrically couplings between the electric fuse 20 and the terminals 60. An electric voltage for flowing an electric current through the electric fuse 20 in breaking of the electric fuse 20 is applied across the terminals 60. The terminals 60 are provided in an upper layer in the interconnect layer 40, which is located higher than the electric fuse 20. The metal cap films 30 are also provided on the terminals 60.

Subsequently, an example of a method for manufacturing the semiconductor device 1 will be presented as an embodiment of a semiconductor device according to the present invention. The method for manufacturing the semiconductor device includes: forming the interconnects 10 in the interconnect layer 40; forming the electric fuse 20 in the layer in the interconnect layer 40 that also includes the interconnect 10; and forming the metal cap films 30 only on the interconnects 10 and not on the electric fuse 20. The interconnects 10 and the electric fuse 20 are formed simultaneously with the same material. More specifically, the process for forming the interconnects 10 and the process for forming the electric fuse 20 are simultaneously implemented.

The metal cap films 30 may be formed by, for example, conducting a plating process over the surface of layer (layer provided with the interconnect 10 and the electric fuse 20), which includes the interconnects 10 and the electric fuse 20 exposed thereon. The plating process is preferably an electroless plating process.

Advantageous effects of the present embodiment will be described. In the present embodiment, the metal cap films 30 are provided only on the interconnects 10 and not provided on the electric fuse 20. More specifically, the upper surface of the electric fuse 20 is not provided with the metal cap film 30. This allows obtaining the interconnects 10 exhibiting higher reliability without deteriorating a breaking ability of the electric fuse 20.

The data ratio in the region in vicinity of the electric fuse 20 (first data ratio), is smaller than the data ratio in the region provided with the interconnect 10 (second data ratio).

This allows easily forming the metal cap films 30 only on the interconnects 10 and not on the electric fuse 20. More specifically, when an electroless plating process is conducted for the surface of the layer including the exposed interconnects 10 and the exposed electric fuse 20, the metal cap films 30 can be grown only on the interconnects 10 while preventing a growth of the cap film 30 on the electric fuse 20. Such advantageous effect is considerably exhibited if the first data ratio is equal to or lower than 5%, and the second data ratio is equal to or higher than 10%.

Figure 4:
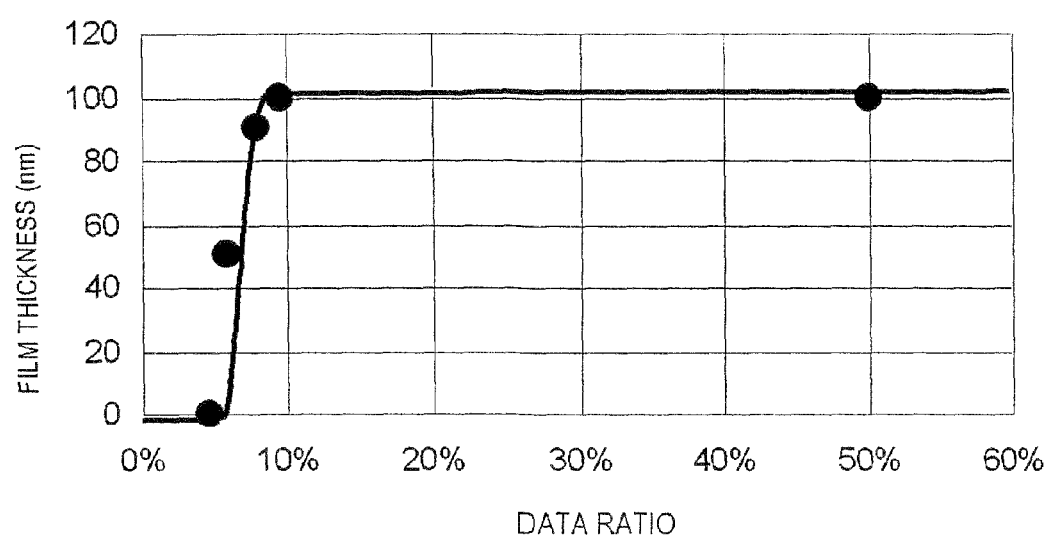
FIG. 4 is graph, useful in describing the advantageous effect of the embodiment.
Figure 5A:
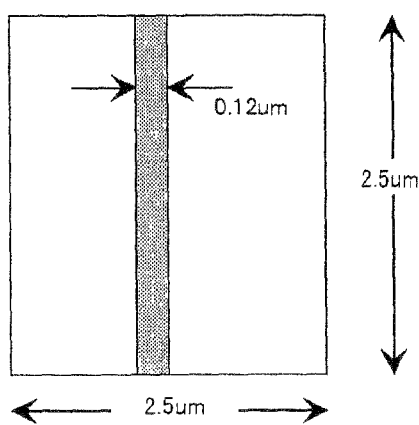
FIGS. 5A and 5B are plan views, useful in describing an advantageous effect of an embodiment.
Figure 5B:
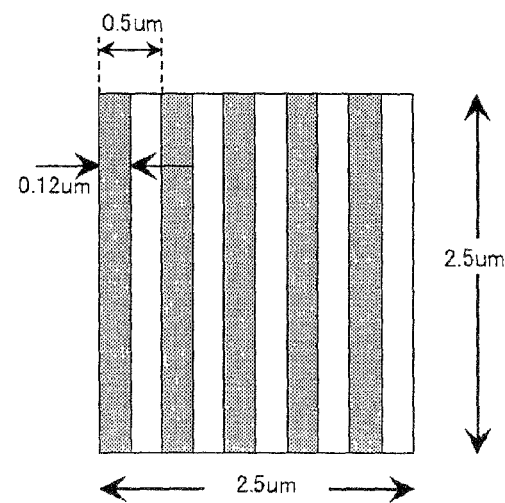
Figure 6A:
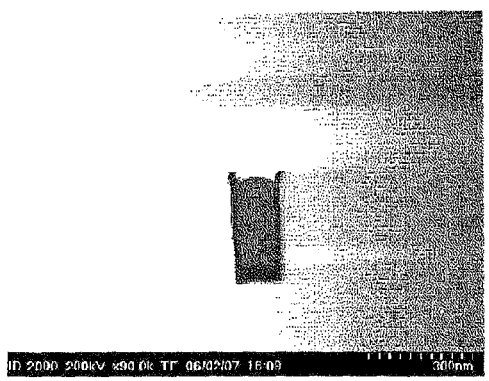
FIGS. 6A and 6B are TEM images, useful in describing an advantageous effect of an embodiment.
Figure 6B:
Figure 7:
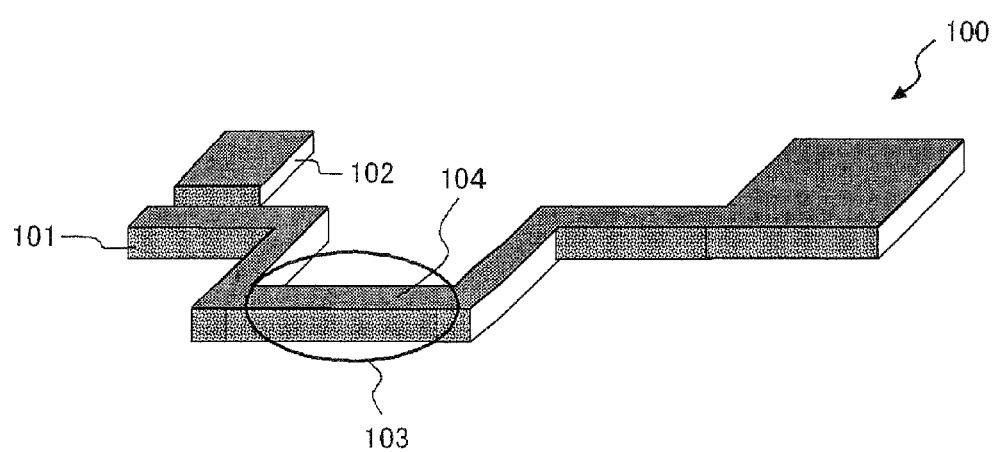
FIG. 7 is a perspective view, showing a conventional semiconductor device.

Such technical feature will be described in reference to FIG. 4, FIGS. 5A and 5B and to FIGS. 6A and 6B. FIG. 4 is a graph, showing the results of the investigation for the relationship of the data ratio with the film thickness of the metal cap film 30. Abscissa represents data ratio (%), and ordinate represents film thickness (nm) of the metal cap film 30 formed via an electroless plating process. In this case, a CoWP film was employed as the metal cap film 30. Further, as shown in FIG. 5A and FIG. 5B, the conductors having a pattern of lines and spaces was employed. In addition to above, the length of 2.5 μm in the graph is equivalent to an interval in the array of conductors in FIG. 5A.

In the case employing the conductors having such pattern, data ratio can be calculated by dividing the width of each of the conductor by the interval of the array and then multiplying the divided width by 100. Concerning FIG. 5A, the width of the conductor of 0.12 μm and the interval in the array of 2.5 μm provide a data ratio of about 5%. Concerning FIG. 5B, the width of the conductor of 0.12 μm and the interval in the array of 0.5 μm provide a data ratio of about 50%. Transmission electron microscope (TEM) images corresponding to FIG. 5A and FIG. 5B are shown in FIG. 6A and FIG. 6B, respectively.

As can be seen from the results shown in FIG. 4, when the data ratio is equal to or lower than 5%, the thickness of the depositing film of the CoWP film is 0 nm. On the other hand, it can be understood that the CoWP film grows to a constant film thickness when the data ratio is not lower than 10%. Therefore, by selecting the first data ratio to be equal to or lower than 5% and the second data ratio to be equal to or higher than 10%, the metal cap films 30 can be easily formed only on the interconnects 10 and not on the electric fuse 20. In addition to above, the CoWP film does not grow in the region where the data ratio is lower, since the level of electron generated during the electroless plating process is insufficient.

Further, as shown in FIG. 2, the dummy interconnects 50 are provided in vicinity of the interconnect 10a, which is provided in a region of relatively lower occupancy of the interconnects 10. This allows providing an increased data ratio of such region, thereby depositing the metal cap film 30 on the interconnect 10a during the electroless plating process.

The terminals 60 are provided in an upper layer which is located higher than the electric fuse 20. As such, the terminals 60 are formed in the upper layer having relatively larger linewidth, and the electric fuse 20 is formed in the lower layer having relatively smaller linewidth, so that a flexible design for the terminal 60 and the electric fuse 20 with the most suitable dimensions can be achieved. More specifically, the terminal 60 can be designed to have relatively larger area and the electric fuse 20 can be designed to be thinner. Thinner electric fuse 20 provides easier breaking.

Meanwhile, the above-listed Japanese Patent Unexamined Publication No. 2005-522,055 for International Application discloses removing a CoWP film on a laser beam fuse via a lithography process. However, when the CoWP film is removed via an etch in a lithographic process, a problem of damaging the Cu interconnect is occurred. Further, another problem of increasing the manufacturing process operations by adding the operation for removing the CoWP film is also caused. On the other hand, in the present embodiment, the deposition of the metal cap film 30 on the electric fuse 20 is avoided when the metal cap film 30 is formed. Therefore, the present invention avoids the need for the operation of removing the metal cap film 30 on the electric fuse 20, such that the above-described problems related to the prior art can be avoided.

Besides, another approach for obtaining a structure, in which the metal cap film is not provided on the electric fuse, may include forming the electric fuse in a layer provided with an interconnect, which is intrinsically not covered with a cap film. However, such layer is generally formed in the upper layer in the interconnect layer, or in other words, in a layer having larger linewidth. Hence, it is difficult to form a narrow electric fuse in such layer, eventually resulting in the electric fuse that is difficult to be broken.

It is intended that the semiconductor device and the method for manufacturing the semiconductor device according to the present invention is not limited to the above-described embodiments, and various modifications thereof are available. Cu is exemplified as a material for the interconnect and the electric fuse in the above-described embodiment. Alternatively, the material may be other interconnect material such as aluminum (Al).

Moreover, the above-described embodiment illustrates that the metal cap film is selectively deposited only on the interconnect by selecting a suitable data ratio. Alternatively, for example, an electroless plating may be conducted while the electric fuse is covered with a mask to selectively deposit the metal cap film only on the interconnect.

It is apparent that the present invention is not limited to the above embodiment, and may be modified and changed without departing from the scope and spirit of the invention.

What is claimed is:

1. A semiconductor device, comprising:
   an interconnect composed of copper and provided in an interconnect layer;
   an electric fuse composed of copper and provided in said interconnect layer, said electric fuse and said interconnect being provided in a same layer in said interconnect layer; and
   a metal cap film provided only on said interconnect and not provided on said electric fuse, wherein said interconnect and said electric fuse having substantially the same thickness.

2. The semiconductor device as set forth in claim 1, wherein a first data ratio, which is a data ratio in a region in vicinity of said electric fuse, is smaller than a second data ratio, which is a data ratio in a region provided with said interconnect.

3. The semiconductor device as set forth in claim 2, wherein said first data ratio is equal to or lower than 5%, and said second data ratio is equal to or higher than 10%.

4. The semiconductor device as set forth in claim 1, wherein a distance between a first conductor and said electric fuse is larger than a distance between a second conductor and said interconnect, said first conductor being provided in the layer that includes said interconnect and being closest to said electric fuse, said second conductor being provided in the layer that includes said interconnect and being closest to said interconnect.

5. The semiconductor device as set forth in claim 1, further comprising a dummy interconnect provided in vicinity of said interconnect.

6. The semiconductor device as set forth in claim 1, further comprising a terminal, which is electrically coupled to an end of said electric fuse,
   wherein said terminal is provided in a layer that is located at higher level than said electric fuse.

7. The semiconductor device as set forth in claim 6, wherein said metal cap film is provided on said terminal.

8. The semiconductor device as set forth in claim 1, wherein said metal cap film contains cobalt (Co) or nickel (Ni).

9. The semiconductor device as set forth in claim 1, wherein said metal cap film is cobalt tungsten phosphorous (CoWP) film.

* * * * *